US009601580B2

(12) United States Patent
Iijima et al.

(10) Patent No.: US 9,601,580 B2
(45) Date of Patent: Mar. 21, 2017

(54) SEMICONDUCTOR DEVICE

(71) Applicant: Kabushiki Kaisha Toshiba, Minato-ku (JP)

(72) Inventors: Ryosuke Iijima, Setagaya (JP); Kazuto Takao, Tsukuba (JP); Tatsuo Shimizu, Shinagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 43 days.

(21) Appl. No.: 14/618,068

(22) Filed: Feb. 10, 2015

(65) Prior Publication Data

US 2015/0270352 A1 Sep. 24, 2015

(30) Foreign Application Priority Data

Mar. 19, 2014 (JP) .................................. 2014-057278

(51) Int. Cl.
| | |
|---|---|
| *H01L 31/0312* | (2006.01) |
| *H01L 29/16* | (2006.01) |
| *H01L 27/092* | (2006.01) |
| *H01L 29/78* | (2006.01) |
| *H01L 27/02* | (2006.01) |

(Continued)

(52) U.S. Cl.
CPC ...... *H01L 29/1608* (2013.01); *H01L 21/8213* (2013.01); *H01L 27/0207* (2013.01); *H01L 27/0605* (2013.01); *H01L 27/092* (2013.01); *H01L 27/0922* (2013.01); *H01L 29/0615* (2013.01); *H01L 29/7816* (2013.01)

(58) Field of Classification Search
CPC ................................................... H01L 29/1608
See application file for complete search history.

(56) References Cited

U.S. PATENT DOCUMENTS

| 5,602,416 A * | 2/1997 | Zambrano | ......... H01L 21/82387 |
| | | | 257/341 |
| 6,734,461 B1 * | 5/2004 | Shiomi | ................... C30B 23/00 |
| | | | 257/194 |

(Continued)

FOREIGN PATENT DOCUMENTS

| JP | 2002-093920 A | 3/2002 |
| JP | 2004-230267 A | 8/2004 |

(Continued)

*Primary Examiner* — Jerome Jackson, Jr.
(74) *Attorney, Agent, or Firm* — Oblon, McClelland, Maier & Neustadt, L.L.P.

(57) ABSTRACT

A semiconductor device includes a first transistor having a first conductivity type SiC layer, a second conductivity type SiC well region, a first conductivity type SiC first source region, a first conductivity type SiC first drain region, and a first gate electrode provided on the well region sandwiched between the first source region and the first drain region. The device includes a second transistor having a second conductivity type SiC second source region, a second conductivity type SiC second drain region provided on the SiC layer, and a second gate electrode provided on the SiC layer sandwiched between the second source region and the second drain region. There is an angle between a direction of a channel forming portion of first transistor and that of the second transistor. The device includes an element isolation region having a bottom positioned in the SiC layer.

9 Claims, 8 Drawing Sheets

(51) Int. Cl.
*H01L 29/06* (2006.01)
*H01L 21/82* (2006.01)
*H01L 27/06* (2006.01)

(56) References Cited

U.S. PATENT DOCUMENTS

| | | | |
|---|---|---|---|
| 2003/0006415 | A1 | 1/2003 | Yokogawa et al. |
| 2004/0070047 | A1 | 4/2004 | Majumdar et al. |
| 2007/0222022 | A1* | 9/2007 | Takeda ............... H01L 29/7816 257/499 |
| 2009/0065877 | A1* | 3/2009 | Tsuchiaki ............... H01L 21/32 257/410 |
| 2012/0326166 | A1* | 12/2012 | Masuda ............... H01L 21/049 257/77 |
| 2014/0034964 | A1* | 2/2014 | Iijima ............... H01L 29/045 257/77 |
| 2015/0061042 | A1* | 3/2015 | Cheng ............... H01L 29/4966 257/412 |

FOREIGN PATENT DOCUMENTS

| | | |
|---|---|---|
| JP | 2006-049668 A | 2/2006 |
| JP | 2011-114036 A | 6/2011 |
| JP | 2014-029951 A | 2/2014 |
| WO | WO 02/097888 A1 | 12/2002 |

* cited by examiner

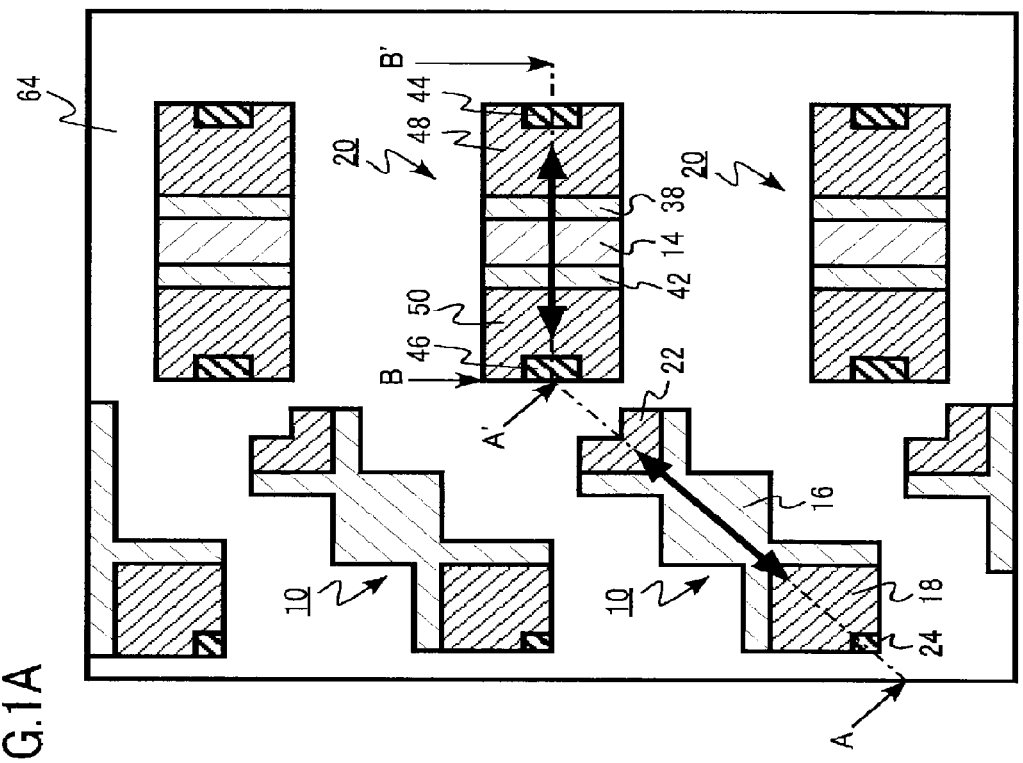
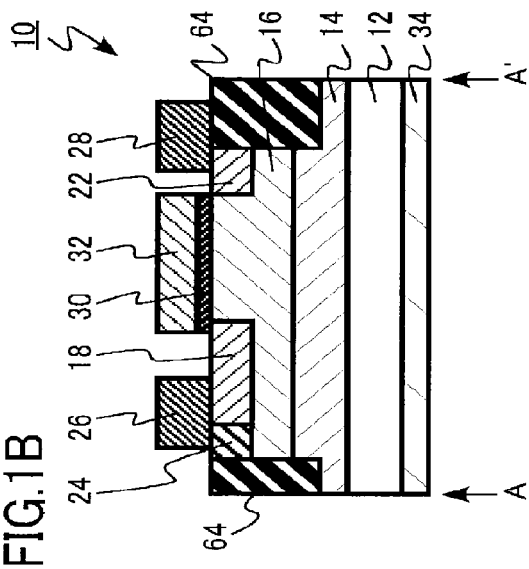
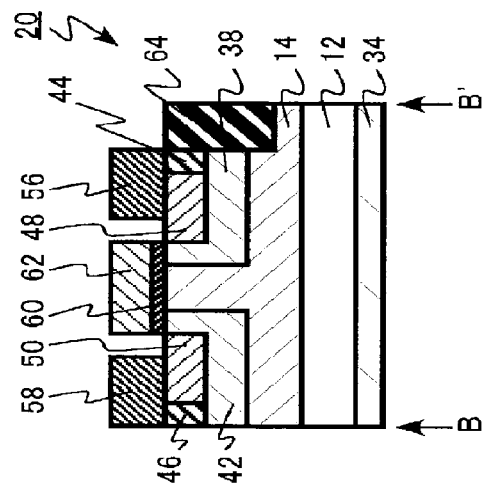

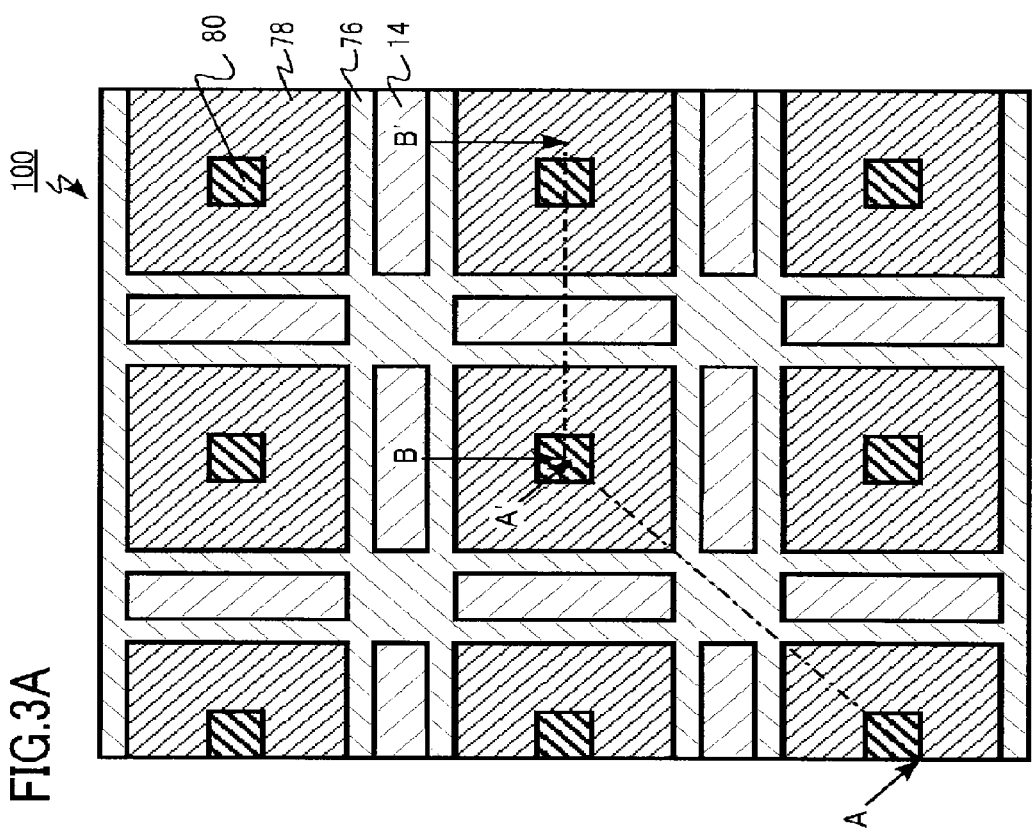
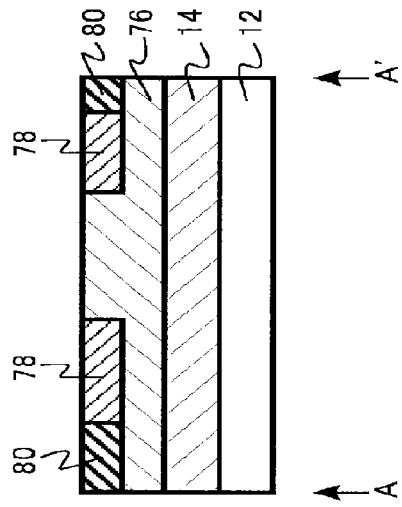
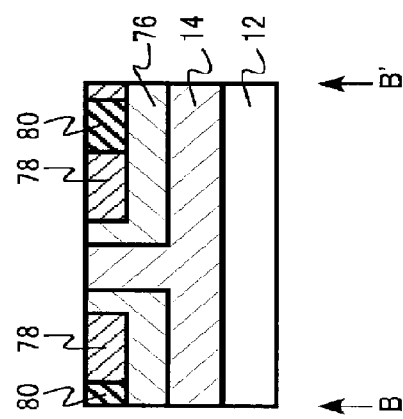
FIG.3A
FIG.3B
FIG.3C

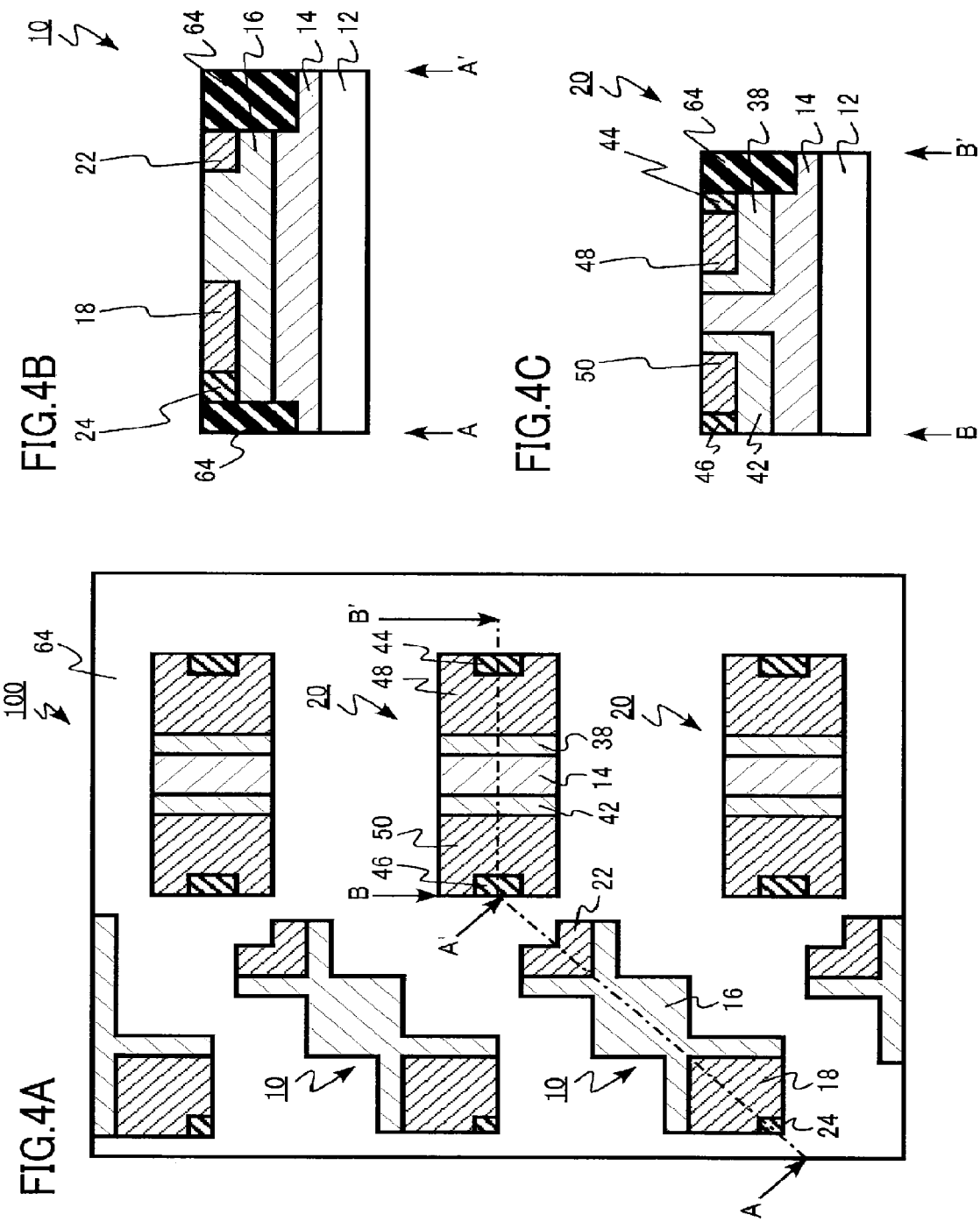

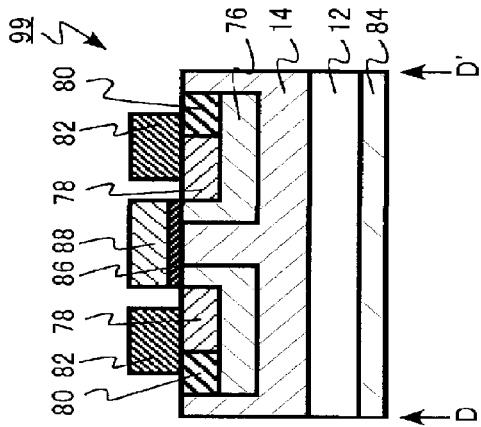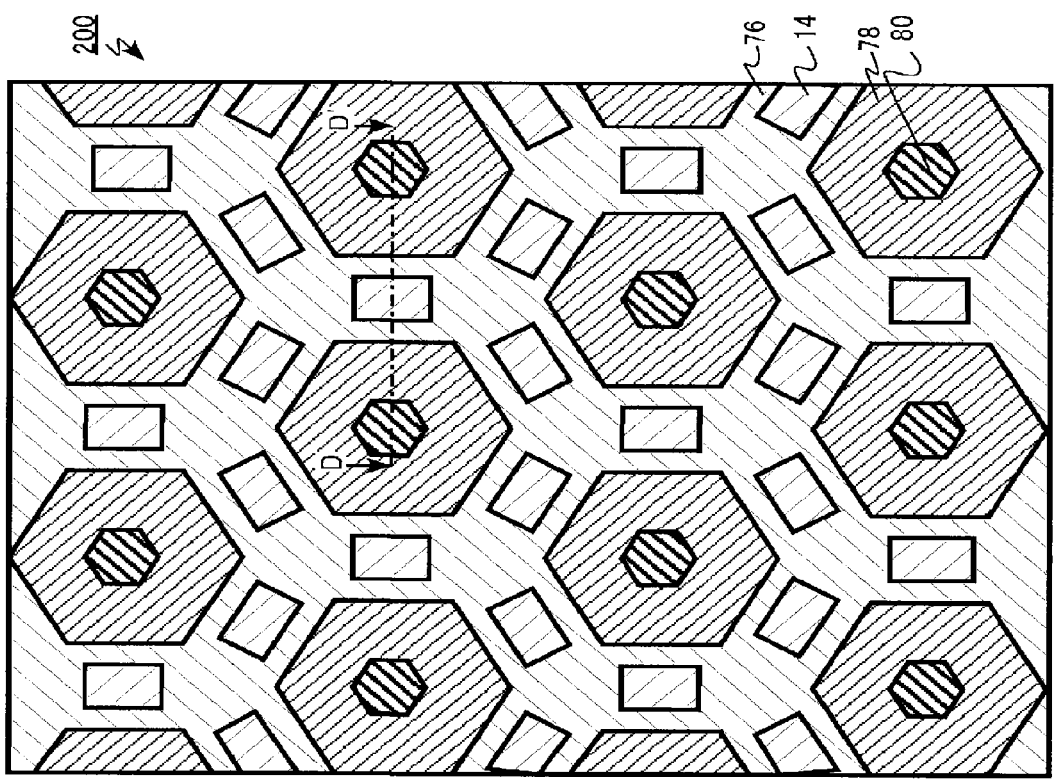

SEMICONDUCTOR DEVICE

CROSS-REFERENCE TO RELATED APPLICATION

This application is based upon and claims the benefit of priority from Japanese Patent Application No. 2014-057278, filed on Mar. 19, 2014, the entire contents of which are incorporated herein by reference.

FIELD

Embodiments described herein relate generally to a semiconductor device.

BACKGROUND

SiC (silicon carbide) is expected to be a material of a semiconductor device of next generation. SiC has an excellent physical property having a bandgap which is three times larger, a breakdown electric field strength which is about ten times stronger, and a thermal conductivity which is about three times larger than these of Si (silicon). The semiconductor device which has a high breakdown voltage and low energy loss and can operate at high temperature can be realized by using these characteristics.

For example, it is expected to realize a CMOS circuit using SiC at low cost for a control circuit which controls the MOSFET and the IGBT with a high breakdown voltage using SiC and an operation circuit which is used under high temperature environment.

BRIEF DESCRIPTION OF THE DRAW

FIGS. 1A to 1C are schematic diagrams of a semiconductor device according to a first embodiment;

FIGS. 3A to 3C are explanatory diagrams of a manufacturing method according to the first embodiment;

FIGS. 4A to 4C are explanatory diagrams of the manufacturing method according to the first embodiment;

FIGS. 6A and 6B are explanatory diagrams of a behavior according to a second embodiment;

DETAILED DESCRIPTION

Figure 2A:
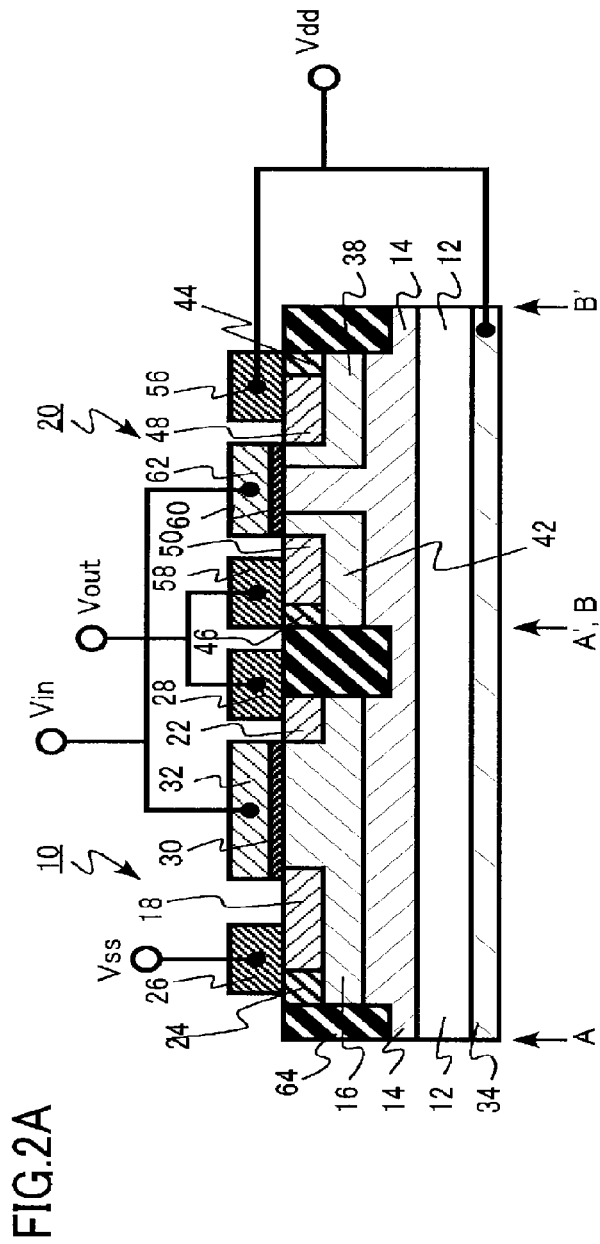
FIGS. 2A and 2B are diagrams of an exemplary circuit structure of the semiconductor device according to the first embodiment.

A semiconductor device according to the embodiments includes a first conductivity type first transistor including a first conductivity type SiC layer, a second conductivity type SiC well region provided on the SiC layer, a first conductivity type SiC first source region provided on the well region, a first conductivity type SiC first drain region provided on the well region, a first source electrode electrically connected to the first source region, a first drain electrode electrically connected to the first drain region, and a first gate electrode provided on the well region between the first source region and the first drain region, a first gate insulating film provided between the well region and the first gate electrode; a second conductivity type second transistor including a second conductivity type SiC second source region provided on the SiC layer, a second conductivity type SiC second drain region provided on the SiC layer, a second source electrode electrically connected to the second source region, a second drain electrode electrically connected to the second drain region, and a second gate electrode provided on the SiC layer between the second source region and the second drain region, a second gate insulating film provided between the SiC layer and the second gate electrode, wherein an angle between a direction of a channel forming portion of the second transistor and a direction of a channel forming portion of the first transistor is larger than 0 degree and smaller than 90 degrees; and an element Isolation region provided between the well region and the second drain region, a bottom of the element isolation region positioned in the SiC layer.

The embodiments of the present disclosure will be described below with reference to the drawings. In the description below, the same member and the like is denoted with the same reference, and the description regarding the described member and the like is appropriately omitted.

Also, in the description below, letters of $n^+$, n, $n^-$, $p^+$, p, and $p^-$ represent the relative level of impurity concentration in each conductive type. That is, $n^+$ indicates the n-type impurity concentration relatively higher than that of n, and n indicates the n-type impurity concentration relatively lower than that of n. Also, $p^+$ the p-type impurity concentration relatively higher than that of p, and $p^-$ indicates the p-type impurity concentration relatively lower than that of p. There is a case where the $n^+$-type and the $n^-$-type are simply described as "n-type" and the $p^+$-type and the $p^-$-type are simply described as "p-type".

Also, in the description below, it is assumed that the concept of "same impurity concentration" includes an error caused by a fluctuation of a process and the like. For example, it is assumed that a difference of about ±5% of an atomic concentration be the "same impurity concentration".

First Embodiment

A semiconductor device of the present embodiment includes a first transistor which is a first conductivity type transistor having a first conductivity type SiC layer, a second conductivity type SiC well region provided on the SiC layer, a first conductivity type SiC first source region provided on the well region, a first conductivity type SiC first drain region provided on the well region, a first source electrode electrically connected to the first source region, a first drain electrode electrically connected to the first drain region, and a first gate electrode provided on the well region sandwiched between the first source region and the first drain region via a first gate insulating film. Also, the semiconductor device of the present embodiment includes a second transistor which is a second conductivity type transistor having a second conductivity type SiC second source region provided on the SiC layer, a second conductivity type SiC second drain region provided on the SiC layer, a second source electrode electrically connected to the second source region, a second drain electrode electrically connected to the second drain region, and a second gate electrode provided on the SiC layer sandwiched between the second source region and the second drain region via a second gate insulating film and having an angle which is larger than 0 degree and smaller than 90 degrees between a direction of a channel forming portion and a direction of a channel forming portion of the first transistor. The semiconductor device further includes a well region and an element isolation region which is provided between the second source region and the second drain region. One end of the element isolation region is positioned on the SiC layer.

FIGS. 1A and 1B are schematic diagrams of the semiconductor device according to the present embodiment. FIG. 1A is a plan schematic diagram, and FIG. 1B is a cross sectional schematic diagram of a cross section of AA' in FIG. 1A. FIG. 1C is a cross sectional schematic diagram of cross section of BB' in FIG. 1A. FIG. 1A is a plan view of the semiconductor device in a state where a source electrode, a drain electrode, a gate insulating film, and a gate electrode have been removed.

The semiconductor device of the present embodiment includes both an n-type metal insulator semiconductor field effect transistor (MISFET) and a p-type MISFET on a single substrate of SiC. The semiconductor device will be described as an example below in a case where the first conductivity type is the n type and a second conductivity type is the p type.

The semiconductor device of the present embodiment includes a plurality of n-toe transistors (first transistor) 10 and a plurality of p-type transistors (second transistor) 20 as illustrated in FIGS. 1A to 1C. Both of the n-type transistor 10 and the p-type transistor 20 are lateral transistors in which carriers flow in a direction parallel to main faces of the substrates.

The n-type transistor 10 includes a SiC substrate 12, a SiC layer 14, a well region 16, a first source region 18, a first drain region 22, a first contact region 24, a first source electrode 26, a first drain electrode 28, a first gate insulating film 30, a first gate electrode 32, and a substrate electrode 34.

The SiC substrate 12 is an n$^+$-type SiC. The SiC substrate 12 includes a first and second faces. The first face is a face on the upper side and the second face is a face on the lower side in FIGS. 1B and 1C. The SiC substrate 12 is a 4H-SiC substrate including, for example, nitrogen (N) having impurity concentration of equal to or higher than $1\times10^{18}$ cm$^{-3}$ and equal to or lower than $1\times10^{20}$ cm$^{-3}$ an n-type impurity.

The first face is, for example, a Si face, that is a {0001} face. Inc first face may offset relative to the Si face, for example, in a range of equal to or higher than 0.5 degrees to equal to or lower than 8 degrees. The first face may be a C face, that is, a {000-1} face.

The SiC layer 14 an n$^-$-type SiC. The SiC layer 14 is provided on the first face of the SiC substrate 2. The n-type impurity concentration of the SiC layer 14 is, for example, equal to or higher than $5\times10^{15}$ cm$^{-3}$ and equal to or lower than $2\times10^{16}$ nm$^{-3}$. The film thickness of the SiC layer 14 is, for example, equal to or more than 5 μm and equal to or less than 100 μm.

The well region 16 is a p-type SiC. The well region 16 is provided on the SiC layer 14. The impurity concentration of the p-type impurities of the well region 16 is, for example, equal to or higher than $5\times10^{15}$ cm$^{-3}$ and equal to or lower than $1\times10^{17}$ cm$^{-3}$. The p-type impurity is, for example, Al (aluminum). The depth of the well region 16 is, for example, about 0.6 μm.

The first source region 16 is an n$^+$-type SiC. The first source region 18 is provided on the surface of the well region 16. The impurity concentration of the n-type impurities of the first source region 18 is, for example, equal to or higher than $1\times10^{13}$ cm$^{-3}$ and equal to or lower than $1\times10^{22}$ cm$^{-3}$.

Also, the first drain region 22 is the n$^+$-type SiC. The first drain region 22 is provided on the surface of the well region 16. The impurity concentration of the n-type impurities of the first drain region 22 is, for example, equal to or higher than $1\times10^{18}$ cm$^{-3}$ and equal to or lower than $1\times10^{22}$ cm$^{-3}$.

The first source electrode 26 is electrically connected to the first source region 18. The first drain electrode 28 is electrically connected to the first drain region 22.

The first source electrode 26 and the first drain electrode 28 are metal electrodes. For example, they are stacked films of nickel (Ni) and aluminum (Al).

The first contact region 24 is a p$^+$-type SiC. The first contact region 24 is provided on the surface of the well region 46. The first contact region 24 is provided between the well region 16 and the first source electrode 26.

The impurity concentration of the p-type impurities of the first contact region 24 is higher than that of the p-type impurities of the well region 16. The impurity concentration of the p-type impurities of the first contact region 24 is, for example, equal to or higher than $1\times10^{18}$ cm$^{-3}$ and equal to or lower than $1\times10^{22}$ cm$^{-3}$.

The first contact region 24 reduces a contact resistance between the first source electrode 26 and the well region 16. The first source electrode 26 applies a voltage to the well region 16.

The first gate electrode 32 is provided on the well region 16 between the first source region 18 and the first drain region 22 via the first gate insulating film 30. The first gate insulating film 30 is provided on the surface of the well region 16.

The first gate insulating film 30 is, for example, a silicon oxide film. The first gate electrode 32 is, for example, a polycrystalline silicon in which the n-type impurities are heavily-doped.

The well region 16 just below the first gate electrode 32 functions as a channel region which allows electrons to flow. The electrons are carriers.

The substrate electrode 34 is provided on the opposite side of the well region 16 of the SiC layer 14. The substrate electrode 34 is provided so as to contact with the second surface of the SiC substrate 12.

The substrate electrode 34 is the metal electrode. For example, the substrate electrode 34 is nickel (Ni).

The p-type transistor 20 includes SiC substrate 12, a SiC layer 14, a second source region 38, a second drain region 42, a second contact region 44, a third contact region 46, a first dummy region 48, a second dummy region 50, a second source electrode 56, a second drain electrode 56, a second gate insulating film 60, a second gate electrode 62, and a substrate electrode 34.

The SiC substrate 12 and the SiC layer 14 are the same as those of the n-type transistor 10.

The second source region 38 and the second drain region 42 are p-type SiCs. The second source region 38 and the second drain region 42 are provided on the SiC layer 14.

The impurity concentrations of the p-type impurities of the second source region 38 and the second drain region 42 are, for example, equal to or higher than $5\times10^{15}$ cm$^{-3}$ and equal to or lower than $1\times10^{17}$ cm$^{-3}$. The p-type impurity is, for example, aluminum (Al). The depth of the well region 16 is, for example, about 0.6 μm.

The second source region 38 and the second drain region 42 have the same impurity concentration and the depth as those of the well region 16 of the n-type transistor 10.

The second source electrode 56 is electrically connected to the second source region 38. The second drain electrode 58 is electrically connected to the second drain region 42.

The second source electrode 56 and the second drain electrode 58 are the metal electrodes. For example, they are tacked films of nickel (Ni) and aluminum (Al).

The second contact region 44 is the p+-type SiC. The second contact region 44 is provided on the surface of the second source region 38. The second contact region 44 is provided between the second source region 38 and the second source electrode 56.

The impurity concentration of the p-type impurities of the second contact region 44 is higher than that of the p-type impurities of the second source region 38. The impurity concentration of the p-type impurities of the second contact region 44 is, for example, equal to or higher than $1 \times 10^{18}$ cm$^{-3}$ and equal to or lower than $1 \times 10^{22}$ cm$^{-3}$.

The second contact region 44 reduces the contact resistance between the second source electrode 56 and the second source region 38.

The third contact region 46 is the p+-type SiC. The third contact region 46 is provided on the surface of the second drain region 42. The third contact region 46 is provided between the second drain region 42 and the second drain electrode 58.

The impurity concentration of the p-type impurities of the third contact region 46 is higher than that of the p-type impurities of the second drain region 42. The impurity concentration of the p-type impurities of the third contact region 46 is, for example, equal to or higher than $1 \times 10^{18}$ cm$^{-3}$ and equal to or lower than $1 \times 10^{22}$ cm$^{-3}$.

The third contact region 46 reduces the contact resistance between the second drain electrode 58 and the second drain region 42.

The second contact region 44 and the third contact region 46 have the same impurity concentration and the depth as those of the first contact region 24.

The first dummy region 48 is the n+-type SiC. The first dummy region 48 is provided between the second source region 38 and the second contact region 44. The impurity concentration of the n-type impurities of the first dummy region 48 is, for example, equal to or higher than $1 \times 10^{18}$ cm$^{-3}$ and equal to or lower than $1 \times 10^{22}$ cm$^{-3}$.

The second dummy region 50 is the n+-type SiC. The second dummy region 50 is provided between the second drain region 42 and the third contact region 46. The impurity concentration of the n-type impurities of the second dummy region 50 is, for example, equal to or higher than $1 \times 10^{18}$ cm$^{-3}$ and equal to or lower than $1 \times 10^{22}$ cm$^{-3}$.

The first dummy region 48 and the second dummy region 50 have same impurity concentration and the depth as those of the first source region 18 and the first drain region 22.

The second gate electrode 62 is provided on the SiC layer 14 sandwiched between the second source region 38 and the second drain region 42 via the second gate insulating film 60. The second gate insulating film 60 is provided on the surface of the SiC layer 14.

The second gate insulating film 60 is, for example, the silicon oxide film. The second gate electrode 62 is, for example, the polycrystalline silicon in which the n-type impurities are heavily-doped.

The SiC layer 14 just below the second gate electrode 62 functions as the channel region which allows holes to flow. The holes are carriers.

It is preferable that the first gate electrode 32 have a work function different from that of the second gate electrode 62 in terms of the adjustment of the threshold voltages of the n-type transistor 10 and the p-type transistor 20. Also, it is preferable that the first gate insulating film 30 be formed of a material different from that of the second gate insulating film 60 in terms of the adjustment of the threshold voltages of the n-type transistor 10 and the p-type transistor 20.

The substrate electrode 34 is provided on the SiC layer 14 on the opposite side of the second source region 38 and the second drain region 42. The substrate electrode 34 is provided so as to contact with the second surface of the SiC substrate 12. The substrate electrode 34 has a function to apply potential to the SiC layer 14 which is the channel region of the p-type transistor 20. The substrate electrode 34 is electrically connected to, for example, the second source electrode 56.

The substrate electrode 34 is the metal electrode. For example, the substrate electrode 34 is nickel (Ni).

The semiconductor device of the present embodiment has an angle which is larger than 0 degree and smaller than 90 degrees between a direction of the channel forming portion of the n-type transistor 10 and a direction of the channel forming portion of the p-type transistor 20 indicated by double-headed arrows in FIG. 1A. In other word, the direction of the channel forming portion of the n-type transistor 10 is not in parallel/perpendicular to that of the channel forming portion of the p-type transistor 20. The direction of the channel forming portion of the n-type transistor 10 is oblique to that of the channel forming portion of the p-type transistor 20.

In the present embodiment, the angle between the direction of the channel forming portion of the n-type transistor 10 and that of the channel forming portion of the p-type transistor 20 is 45±5 degrees. The direction of the channel forming portion is defined as a direction of a segment of a line connecting points so that a distance between the source region and the drain region of the transistor becomes the shortest.

Also, t semiconductor device of the present embodiment includes an element isolation region 64. The element isolation region 64 isolates between the respective n-type transistors 10, between the respective p-type transistors 20, and between the n-type transistor 10 and the p-type transistor 20.

The element isolation region 64 is provided between the well region 16 of the n-type transistor 10 and the second source region 35 and the second drain region 42 of the p-type transistor 20. One end of the element isolation region 64 is positioned in the SiC layer 14. In other word, f e bottom of the element isolation region 64 is provided in the SiC layer 14.

The element isolation region 64 is formed by the insulating film, with which a trench formed in the SiC layer 14 is buried. Inc insulating film is, for example, a silicon oxide film. The bottom of the trench passes through the well region 16, the second source region 38, and the second drain region 42 and reaches the SiC layer 14.

For example, each electrode of the n-type transistor 10 and the p-type transistor 20 is electrically connected to each other by a wiring layer not shown. The wiring layer includes, for example, a metal wiring and an interlayer film for insulating the metal wirings.

Figure 2B:
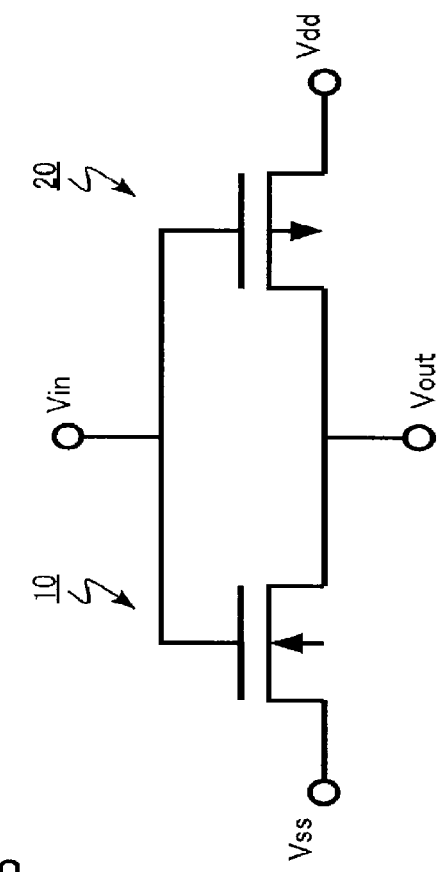

FIGS. 2A and 2B are diagrams of an exemplary circuit structure of the semiconductor device of the present embodiment. FIG. 2A is a schematic cross sectional diagram, and FIG. 2B is an equivalent circuit diagram. FIG. 2A corresponds to a cross section of AB' in FIG. 1A.

FIGS. 2A and 2B are diagrams of a CMOS device including a CMOS inverter circuit. The n-type transistor 10 is connected in series to the p-type translator 20. The first source electrode 26 of the n-type transistor 10 is connected to a ground potential (Vss). The source electrode 56 of the p-type transistor is connected to a power supply voltage (Vdd).

The first gate electrode 32 and the second gate electrode 62 are connected to an input terminal, and an input signal (Vin) is input. Also, the first drain electrode 28 and the second drain electrode 58 are connected to an output terminal, and an output signal (Vout) is output.

Next, a manufacturing method for the semiconductor device of the present embodiment will be described. FIGS. 3A to 3C and FIGS. 4A to 4C are explanatory diagrams of the manufacturing method for the semiconductor device of the present embodiment. FIG. 3A is a plan schematic diagram, and FIG. 3B a cross sectional schematic diagram of a cross section of AA' in FIG. 3A. FIG. 3C is a cross sectional schematic diagram of the cross section of AA' in FIG. 3A, and FIG. 4C is a cross sectional schematic diagram of a cross section of BB' in FIG. 4A.

First, a SiC wafer 100 formed for a power semiconductor is prepared. The SiC wafer 100 is, for example, a substrate for manufacturing a vertical MOSFET.

The SiC wafer 100 forms the SiC layer 14 on the SiC substrate 12 by using an epitaxial growth method. After that, ions are implanted in the SiC layer 14, and an impurity layer which is optimized for the vertical MOSFET is formed (FIGS. 3A to 3C). The vertical MOSFET is, for example, a double implantation MOSFET (DIMOSFET) in which a p channel region and a source region are formed by the ion implantation. Specifically, a p-type SiC region 76, an $n^+$-type SiC region 78, and a $p^+$-type SiC region 80 are formed in the SiC layer 14 by the ion implantation.

A pattern of the impurity layers of the SiC wafer 100 is a pattern in which unit patterns basically formed by squares are repeatedly disposed in an array as indicated in FIG. 3A.

Next, the element isolation region 64 is formed on the SiC wafer 100 (FIGS. 4A to 4C). The element isolation region 64 is formed deeper than the p-type SiC region 76.

The SiC layer 14, the p-type SiC region 76, the $n^+$-type SiC region 78, and the $p^+$-type SiC region 80 are divided into a region for the n-type transistor 10 and a region for the p-type transistor 20 by the element isolation region 64. The well region 16, the first source region 18, the first drain region 22, and the first contact region 24 of the n-type transistor 10 and the second source region 38, the second drain region 42, the second contact region 44, the third contact region 46, the first dummy region 48, and the second dummy region 50 of the p-type transistor 20 are formed.

After that, the first source electrode 26, the first drain electrode 28, the first gate insulating film 30, and the first gate electrode 32 of the n-type transistor 10 and the second source electrode 56, the second drain electrode 58, the second gate insulating film 60, and the second gate electrode 62 of the p-type transistor 20 are formed. In addition, a substrate electrode 34 is formed.

With the manufacturing method mentioned above, the semiconductor device of the present embodiment illustrated in FIGS. 1A to 1C is manufactured.

Figure 5B:
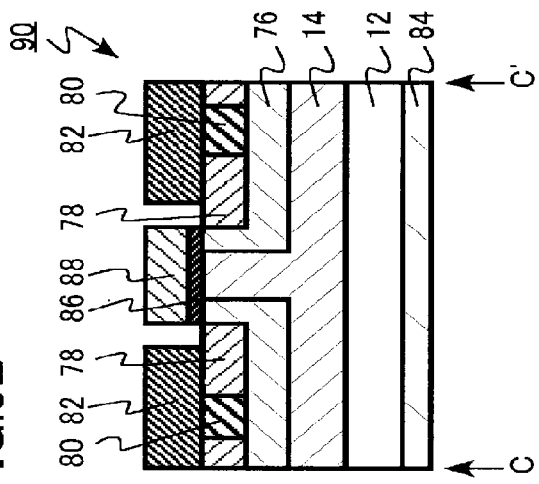
FIGS. 5A and 5B are explanatory diagrams of a behavior according to the first embodiment.
Figure 5A:
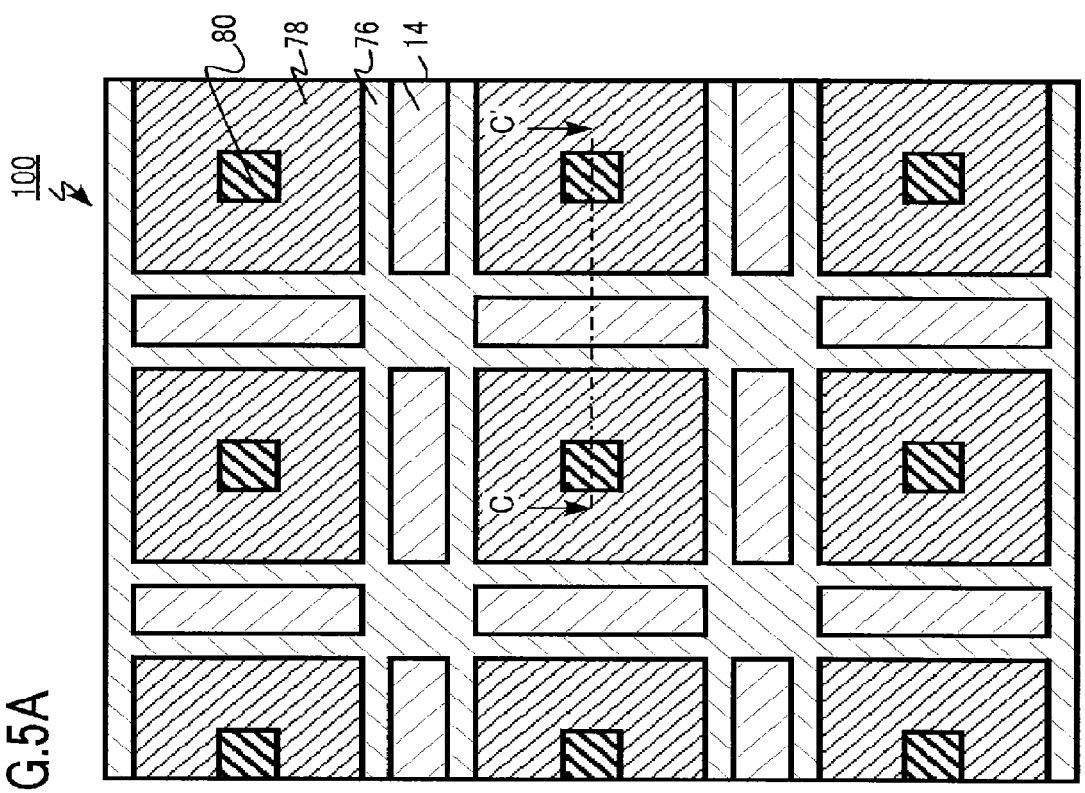

FIGS. 5A and 5B are explanatory diagrams of a behavior according to the present embodiment. FIG. 5A is a plan schematic diagram of the SiC wafer 100 used for manufacturing the semiconductor device and the vertical MOSFET of the present embodiment. FIG. 5B is a schematic cross sectional diagram of the vertical MOSFET manufactured by using the SiC wafer 100. FIG. 5B is the cross sectional schematic diagram corresponding to a cross section of CC' in FIG. 5A.

The SiC wafer 100 forms the SiC layer 14 on the SiC substrate 12 by using the epitaxial growth method, and the p-type SiC region 76, the $n^+$-type SiC region 78, and the $p^+$-type SiC region 80 are formed in the SiC layer 14 by the ion implantation.

A vertical MOSFET 90 includes a SiC substrate 12, a drift layer (SiC layer) 14, a base region (p-type SiC region) 76, a source region ($n^+$-type SiC region) 78, a base contact region ($p^+$-type SiC region) 80, a source electrode 82, a drain electrode 84, a gate insulating film 86, and a gate electrode 88.

As described above, according to the semiconductor device of the present embodiment, the CMOS circuit using the SiC can be realized by using the SiC wafer 100 where the impurity layer optimized for the vertical SiC-MOSFET has been formed. Therefore, the CMOS device, which has a high breakdown voltage and low loss and can operate at high temperature, can be manufactured at low cost without forming a dedicated impurity layer.

When the CMOS circuit is formed by using the SiC wafer 100 in which the impurity layer optimized for the vertical SiC-MOSFET is formed, the CMOS circuit with high integration and high performance is realized by forming a pattern in which the direction of the channel forming portion of the n-type transistor 10 is oblique to that of the channel forming portion of the p-type transistor 20.

Also, in the present embodiment, the p-type transistor 20 includes the $n^+$-type first and second dummy regions 48 and 50 on the side of the substrate at the end of the second gate electrode 62. Since the p-type region does not exist the gate end, injection of the holes from the substrate to the insulating film at the end of the second gate electrode 62 is prevented. Therefore, degradation of reliability at the gate end caused by insulating film breakdowns and the like can be prevented.

The CMOS inverter circuit has been described as an example in FIGS. 2A and 2B. However, a CMOS circuit having various functions can be realized by changing the connection by the wiring layer between the n-type transistor 10 and the p-type transistor 20. Therefore, for example, the CMOS device can be manufactured which includes a gate driving circuit of an inverter for power conversion using a SiC vertical power device, a protection circuit, a logical operation circuit, or the like.

Also, for example, the number and the disposition of the n-type transistors 10 and the p-type transistors 20 can be in a desired form by changing the pattern of the element isolation regions 64.

Second Embodiment

A semiconductor device of the present embodiment is similar to that of the first embodiment except for a point such that a pattern of the n-type transistors is different from that of the p-type transistor. Therefore, the description regarding component overlapped with those in the first embodiment is omitted.

FIGS. 6A and 6B are explanatory diagrams of a behavior according to the present embodiment. FIG. 6A is a plan schematic diagram of a SiC wafer 200 used for manufacturing the semiconductor device and a vertical MOSFET of the present embodiment. FIG. 6B is a schematic crass sectional diagram of the vertical MOSFET manufactured by using the SiC wafer 200. FIG. 6B is the cross sectional schematic diagram corresponding to a cross section of DD' in FIG. 6A.

The SiC wafer 200 forms a SiC layer 14 on a SiC substrate 12 by using an epitaxial growth method. After that, ions are implanted in the SiC layer 14, and an impurity layer which is optimized for the vertical MOSFET is formed. The vertical MOSFET is, for example, a double implantation MOSFET (DIMOSFET) in which a p channel region and a source region are formed by the ion implantation. Specifically, a p-type SiC region 76, an n$^+$-type SiC region 78, and a p$^+$-type SiC region 80 are formed in the SiC layer 14 by the ion implantation.

A pattern of the impurity layers of the SiC wafer 200 is a pattern in which unit patterns basically formed by hexagons are repeatedly disposed in an array as indicated in FIG. 6A.

A vertical MOSFET 99 includes the SiC substrate 12, a drift layer (SiC layer) 14, a base region (p-type SiC region) 76, a source region (n$^+$-type SiC region) 78, a base contact region (p$^+$-type SiC region) 80, a source electrode 82, a drain electrode 84, a gate insulating film 86, and a gate electrode 88.

Figure 7:
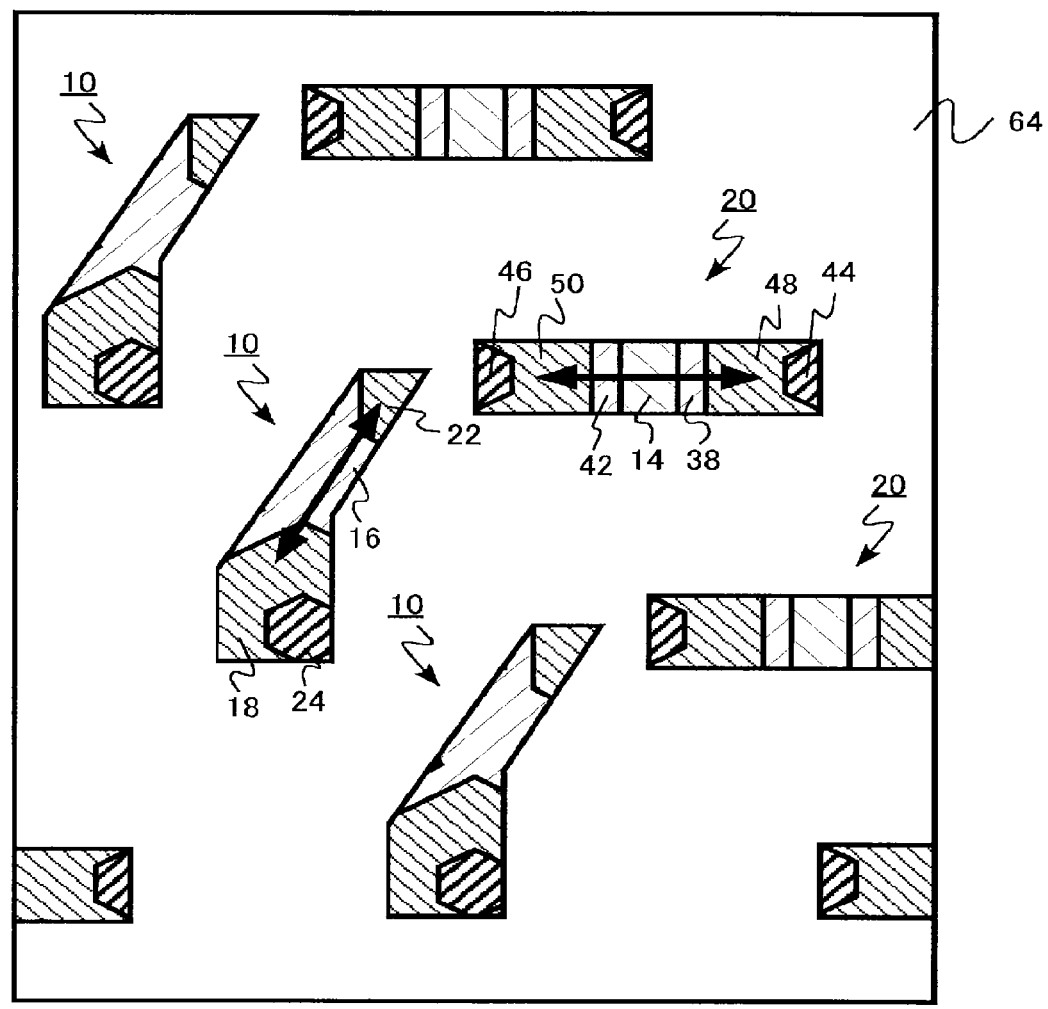
FIG. 7 is a plan schematic diagram of the semiconductor device according to the second embodiment.

FIG. 7 is a plan schematic diagram of the semiconductor device of the present embodiment. FIG. 7 is a plan view of the semiconductor device in a state where a source electrode, a drain electrode, a gate insulating film, and a gate electrode have been removed.

The SiC layer 14, the p-type SiC region 76, the n$^+$-type SiC region 78, and the p$^+$-type SiC region 80 of the SiC wafer 200 are divided into a region for an n-type transistor 10 and a region for a p-type transistor 20 by an element isolation region 64. A well region 16, a first source region 18, a first drain region 22, and a first contact region 24 of the n-type transistor 10 and a second source region 38, a second drain region 42, a second contact region 44, a third contact region 46, a first dummy region 48, and a second dummy region 50 of the p-type transistor 20 are formed.

In the n-type transistor 10, a first source electrode, a first drain electrode, a first gate insulating film, and a first gate electrode not shown are formed similarly to the first embodiment. Also, in the p-type transistor 20, a second source electrode, a second drain electrode, a second gate insulating film, a second gate electrode, and a substrate electrode 34 not shown are formed similarly to the first embodiment.

The semiconductor device of the present embodiment has an angle which is larger than 0 degree and smaller than 90 degrees between a direction of a channel forming portion of the n-type transistor 10 and a direction of a channel forming portion of the p-type transistor 20 indicated by double-headed arrows in FIG. 7. In the present embodiment, the angle between the direction of the channel forming portion of the n-type transistor 10 and that of the channel forming portion of the p-type transistor 20 is 60±5 degrees.

As described above, according to the semiconductor device of the present embodiment, the CMOS circuit using the SiC can be realized by using the SiC wafer 200 where the impurity layer optimized for the vertical SiC-MOSFET has been formed similarly to the first embodiment. Therefore, the CMOS device, which has a high breakdown voltage and low loss and can operate at high temperature, can be manufactured at low cost without forming a dedicated impurity layer.

Third Embodiment

A semiconductor device of the present embodiment is similar to that of the first embodiment except for a point such that the semiconductor device is a power semiconductor module in which the semiconductor device of the first embodiment and the SiC power semiconductor are mixedly mounted. Therefore, the description regarding components overlapped with those in the first embodiment is omitted.

Figure 8:
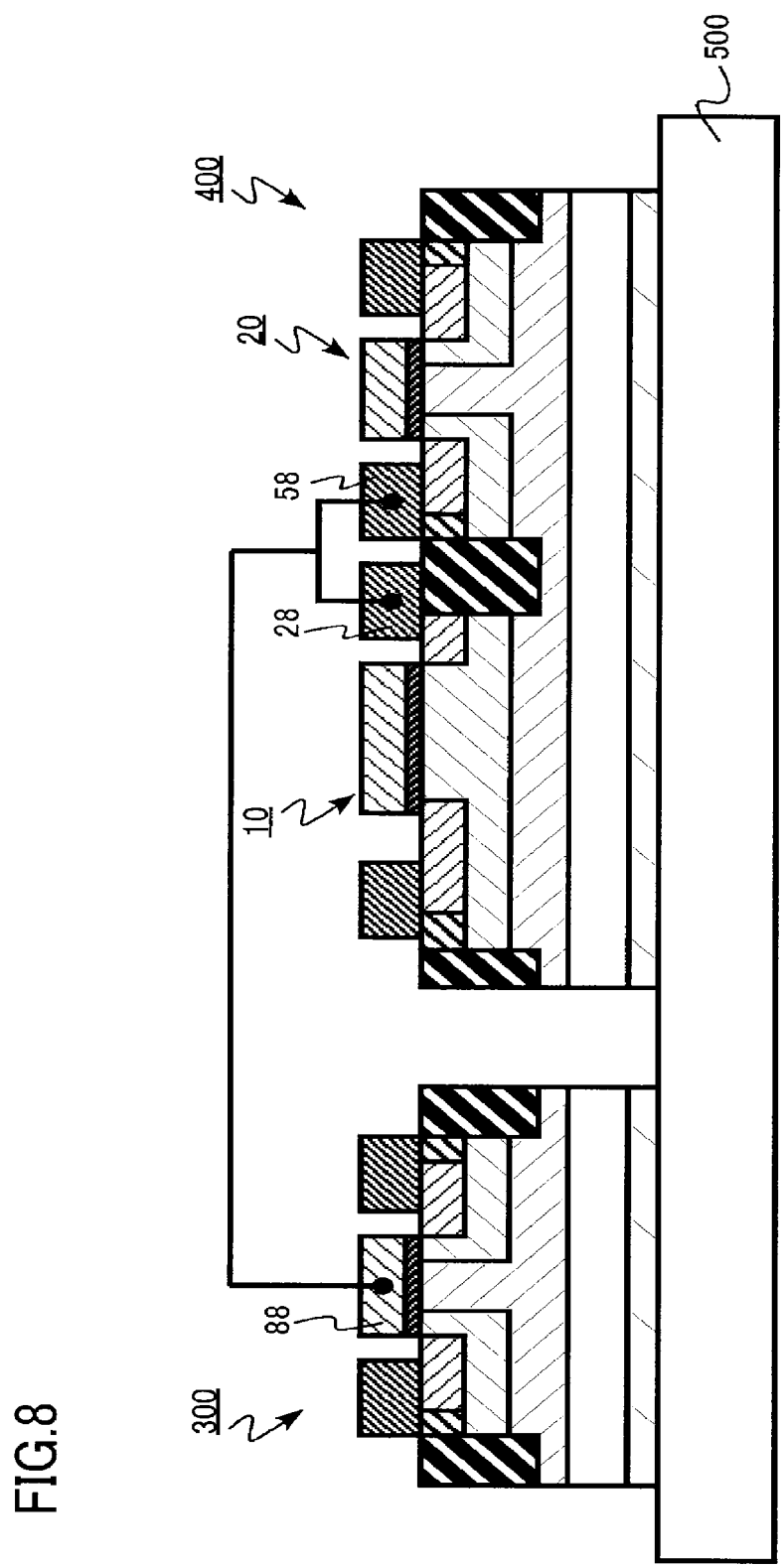
FIG. 8 is a schematic cross sectional diagram of a semiconductor device according to a third embodiment.

FIG. 8 is a schematic cross sectional diagram of the semiconductor device of the present embodiment. The power semiconductor module of the present embodiment has a SiC power semi-conductor 300 and a SiC CMOS device 400 mounted on a single substrate 500. The substrate 500 is, for example, a resin or metal.

The SiC power semiconductor 300 is, for example, a vertical MOSFET. For example, an inverter for power conversion is configured of a vertical MOSFET.

The CMOS device 400 includes a plurality of n-type transistors 10 and a plurality of p-type transistors 20. The CMOS device 400 is, for example, a device for a gate driving circuit of the vertical MOSFET.

For example, as illustrated in FIG. 8, output signals from a drain electrode 8 of the n-type transistor 10 of the CMOS device 400 and a drain electrode 58 of the p-type transistor 20 are input to a gate electrode 88 of the vertical MOSFET 300, and the vertical MOSFET 300 is controlled.

The vertical MOSFET 00 and the CMOS device 400 are manufactured by using the SiC wafer in which the impurity layers have been formed, and a pattern of the impurity layers of the vertical MOSFET 300 is the same as that of the impurity layer of the CMOS device 400.

According to the present embodiment, the SiC power semiconductor 300 and the SiC CMOS device 400 which can be manufactured by using the SiC wafer having the same pattern are mounted on the single substrate 500. Therefore, all the inverter functions including a control circuit can be easily configured of a SiC device. Accordingly, a semiconducter module in which whole inverter system is ensured to operate at high temperature can be manufactured at low cost.

The Si face of 4H-SiC has been described in t embodiments above. However, the present disclosure can be realized on a C face, an A face, an M face, and other plane direction. Also, a case where a crystal structure of silicon carbide is 4H-SiC has been described as an example. However, other crystal structures of the silicon carbide such as 6H-SiC and 3C-SiC can be applied to the present disclosure.

Also, a case where the first conductivity type is the n type and the second conductivity type is the p-type has been described as an example in the embodiments. However, a structure can be used in which the first conductivity type is the p type and the second conductivity type is the n type.

Also, a case where the pattern of the impurity layers of the semiconductor device includes unit patterns basically formed by squares or hexagons has been described as an example in the embodiments. However, the pattern can include unit patterns formed by other polygons such as circles and octagons.

While certain embodiments have been described, these embodiments have been presented byway of example only, and are not intended to limit the scope of the inventions. Indeed, a semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   an n conductivity type first transistor including an n conductivity type SiC layer, a p conductivity type SiC well region provided on the SiC layer, an n conductivity type SiC first source region provided on the well region, an n conductivity type SiC first drain region provided on the well region, a first source electrode electrically connected to the first source region, a first drain electrode electrically connected to the first drain region, and a first gate electrode provided on the well region between the first source region and the first drain region, a first gate insulating film provided between the well region and the first gate electrode;

a p conductivity type second transistor including a p conductivity type SiC second source region provided on the SiC layer, a p conductivity type SiC second drain region provided on the SiC layer, a second source electrode electrically connected to the second source region, a second drain electrode electrically connected to the second drain region, and a second gate electrode provided on the SiC layer between the second source region and the second drain region, a second gate insulating film provided between the SiC layer and the second gate electrode, an n conductivity type SiC first dummy region provided between the second source region and a second contact region, an n conductivity type SiC second dummy region provided between the second drain region and a third contact region, wherein an angle between a direction of a channel forming portion of the second transistor and a direction of a channel forming portion of the first transistor is larger than 0 degree and smaller than 90 degrees; and an element isolation region provided between the well region and the second drain region, a bottom of the element isolation region positioned in the SiC layer.

2. The device according to claim 1, further comprising:
a first contact region provided between the well region and the first source electrode, the first contact region including a second conductivity type impurity having concentration higher than that of the well region.

3. The device according to claim 1, further comprising:
the second contact region provided between the second source region and the second source electrode, the second contact region including a p conductivity type impurity having concentration higher than that of the second source region; and
the third contact region provided between the second drain region and the second drain electrode, the third contact region including a p conductivity type impurity having concentration higher than that of the second drain region.

4. The device according to claim 1, further comprising:
a substrate electrode provided on the opposite side of the second source region and the second drain region of the SiC layer, the substrate electrode being electrically connected to the second source electrode.

5. The device according to claim 1, wherein
the well region, the second source region, and the second drain region have a same impurity concentration.

6. The device according to claim 1, wherein
the angle is 45±5 degrees.

7. The device according to claim 1, wherein
the angle is 60±5 degrees.

8. The device according to claim 1, wherein
the first gate electrode has a work function that differs from a work function of the second gate electrode.

9. The device according to claim 1, wherein
a material of the first gate insulating film is different from that of the second gate insulating film.

* * * * *